(12) United States Patent
Walker et al.

(10) Patent No.: US 9,362,893 B2
(45) Date of Patent: Jun. 7, 2016

(54) APPARATUS AND METHODS FOR SWITCH-COUPLED OSCILLATORS

(71) Applicant: Analog Devices, Inc., Norwood, MA (US)

(72) Inventors: Benjamin P. Walker, Cambridge, MA (US); Robert J. Broughton, Chester, NH (US); Edmund J. Balboni, Littleton, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 33 days.

(21) Appl. No.: 14/312,313

(22) Filed: Jun. 23, 2014

(65) Prior Publication Data
US 2015/0372664 A1 Dec. 24, 2015

(51) Int. Cl.
H03K 3/12 (2006.01)
H03K 3/012 (2006.01)
H03B 5/12 (2006.01)
H03B 9/14 (2006.01)

(52) U.S. Cl.
CPC ............... *H03K 3/012* (2013.01); *H03B 5/12* (2013.01); *H03B 5/1228* (2013.01); *H03B 9/14* (2013.01); *H03B 2200/0076* (2013.01); *H03B 2200/0082* (2013.01)

(58) Field of Classification Search
CPC ............... H03K 3/03; H03K 3/12; H03L 7/24
USPC .................. 331/2, 46, 47, 50, 51, 56
See application file for complete search history.

(56) References Cited

U.S. PATENT DOCUMENTS

| | | | |
|---|---|---|---|
| 4,629,999 A * | 12/1986 | Hatch | .............. H03L 7/199 331/1 R |
| 6,249,189 B1 | 6/2001 | Wu et al. | |
| 6,556,089 B2 | 4/2003 | Wood | |
| 6,977,557 B1 | 12/2005 | Frerking | |
| 7,236,060 B2 | 6/2007 | Wood | |
| 7,683,726 B2 | 3/2010 | Kim | |
| 8,508,308 B2 * | 8/2013 | Dong | ................ H03L 7/08 327/147 |
| 8,558,625 B1 | 10/2013 | Lie et al. | |

(Continued)

FOREIGN PATENT DOCUMENTS

CN 102170289 A 8/2011

OTHER PUBLICATIONS

Partial European Extended Search Report mailed Oct. 29, 2015 in Application No. 15171538.0 (7 pages).

(Continued)

*Primary Examiner* — Jeffrey Shin
(74) *Attorney, Agent, or Firm* — Knobbe Martens Olson & Bear LLP

(57) ABSTRACT

Apparatus and methods for switch-coupled oscillators are disclosed. In certain implementations, an oscillator system includes a primary oscillator, one or more auxiliary oscillators, one or more switching circuits, and an oscillator control circuit. The oscillator control circuit can be used to control the one or more switching circuits to selectively couple the primary oscillator to all or a portion of the one or more auxiliary oscillators. The oscillator control circuit can also disable any auxiliary oscillators that are decoupled from the primary oscillator to reduce power consumption. By selecting a number of auxiliary oscillators to couple to the primary oscillator, the oscillator system can have a configurable phase noise versus power consumption profile.

25 Claims, 7 Drawing Sheets

(56) References Cited

U.S. PATENT DOCUMENTS

| | | | |
|---|---|---|---|
| 8,570,108 B2* | 10/2013 | Ragunathan | H03K 3/0315 331/172 |
| 8,629,807 B2 | 1/2014 | Wood et al. | |
| 2005/0104666 A1 | 5/2005 | Rebel | |
| 2007/0247237 A1 | 10/2007 | Mohammadi | |
| 2008/0042755 A1* | 2/2008 | Feygin | H03L 1/026 331/2 |
| 2009/0215423 A1 | 8/2009 | Hwang et al. | |
| 2010/0271086 A1 | 10/2010 | Bao et al. | |
| 2012/0112841 A1 | 5/2012 | Hayashi | |
| 2013/0033331 A1 | 2/2013 | Raghunathan et al. | |
| 2013/0296217 A1 | 11/2013 | Afshari et al. | |
| 2014/0070898 A1 | 3/2014 | Shirinfar et al. | |

OTHER PUBLICATIONS

Extended European Search Report for European Patent Application No. 15171538.0, dated Feb. 17, 2016 in 13 pages.

* cited by examiner

APPARATUS AND METHODS FOR SWITCH-COUPLED OSCILLATORS

BACKGROUND

1. Field

Embodiments of the invention relate to electronic systems, and more particularly, to electronic oscillators.

2. Description of the Related Technology

Electronic oscillators can be used in a variety of applications, including, for example, telecommunications systems, optical networks, radar systems, and/or chip-to-chip communication. In one example, an oscillator can be used in a frequency synthesizer to generate an output clock signal having a controlled phase and frequency relationship to a reference clock signal. In other examples, an oscillator can be used for clock and data recovery, for modulation or demodulation, and/or in a phase-locked loop (PLL).

An oscillator's noise and power consumption are two important performance considerations. For example, certain devices such as transceivers can have relatively stringent noise specifications that can be difficult to meet due to oscillator noise. One type of noise in an oscillator is phase noise, or a frequency domain representation of short-term fluctuations in a phase of a waveform caused by time domain instabilities. Power consumption of an oscillator can also be important. For example, when the oscillator is included in a mobile device, the oscillator's power consumption can impact the device's battery life.

SUMMARY

In one aspect, an apparatus includes a primary oscillator, one or more auxiliary oscillators including a first auxiliary oscillator, and one or more switching circuits including a first switching circuit. The first switching circuit includes a first state and a second state. The first switching circuit is configured to couple the primary oscillator and the first auxiliary oscillator in the first state, and to decouple the primary oscillator and the first auxiliary oscillator in the second state. The apparatus further includes an oscillator control circuit having a first output configured to provide a first switch control signal. The operation of the first switching circuit in the first state or second state is controlled at least in part by the first switch control signal.

In another aspect, an electronically implemented method of electronic oscillation is provided. The method includes generating a clock signal using an oscillator system including a primary oscillator, a plurality of auxiliary oscillators, and a plurality of switching circuits. The method further includes coupling a first portion of the plurality of auxiliary oscillators to the primary oscillator using a first portion of the plurality of switching circuits, and decoupling a second portion of the plurality of auxiliary oscillators from the primary oscillator using a second portion of the plurality of switching circuits. The method further includes disabling the second portion of the plurality of auxiliary oscillators using an oscillator control circuit to reduce power consumption.

DETAILED DESCRIPTION OF EMBODIMENTS

Figure 1:
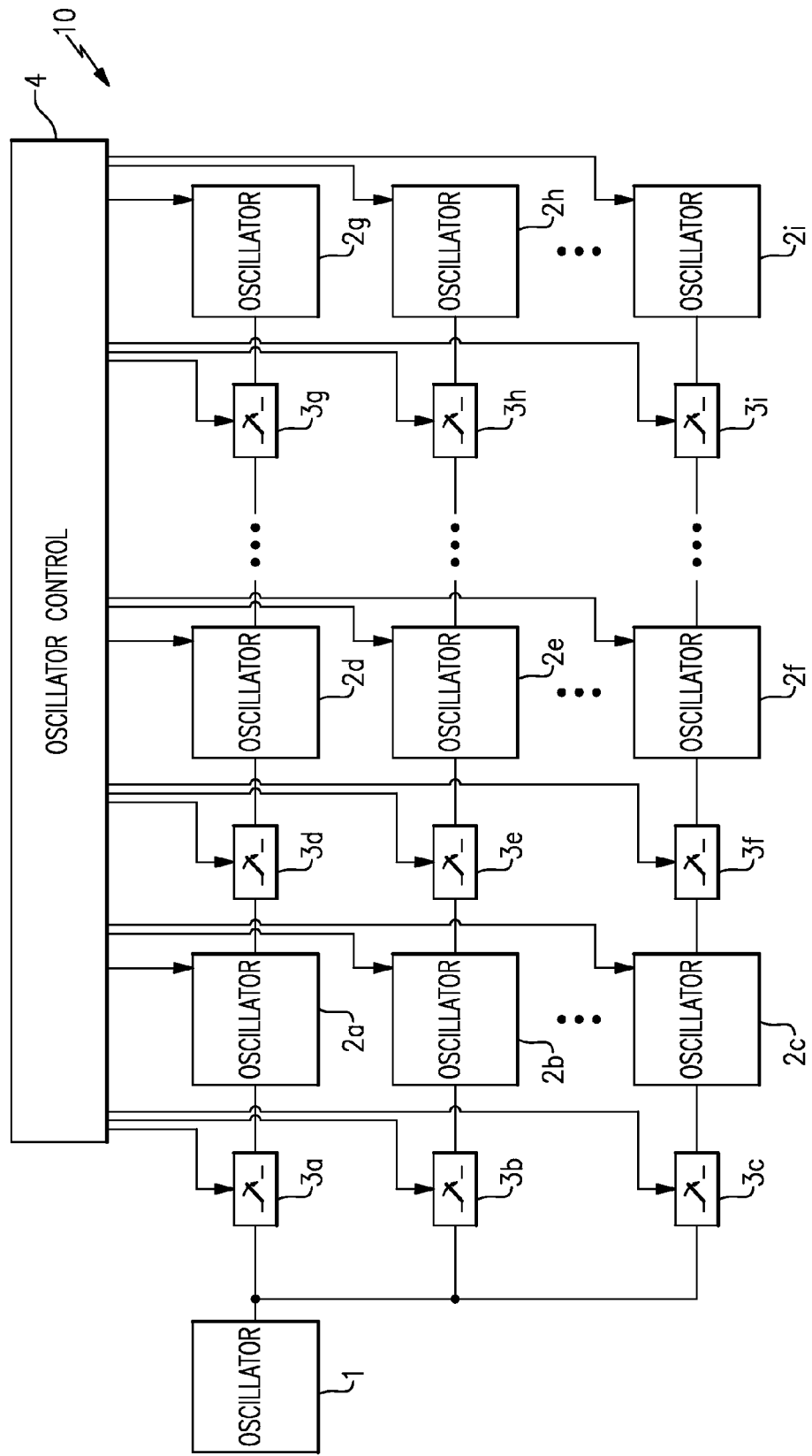
FIG. 1 is a schematic diagram of one embodiment of an oscillator system.

The following detailed description of embodiments presents various descriptions of specific embodiments of the invention. However, the invention can be embodied in a multitude of different ways as defined and covered by the claims. In this description, reference is made to the drawings where like reference numerals may indicate identical or functionally similar elements.

An oscillator can generate a clock signal that can be used for a variety of purposes. An oscillator's phase noise can be impact the performance of an electronic system using the oscillator. For example, when the oscillator is used as a local oscillator in a transmitter or receiver, the oscillator's phase noise can impact the spectral purity of modulated or demodulated signals.

When two or more oscillators are coupled together, the oscillators can be synchronized, and the phase noise of the coupled oscillators can be reduced. For example, when two oscillators are coupled together and oscillate at a common frequency, the phase noise of the resulting oscillator can be about 3 dB smaller than the phase noise of each oscillator individually. Although coupling oscillators can reduce phase noise, coupling oscillators can also undesirably increase power consumption. For instance, n oscillators coupled together may have a net power consumption that is about a factor of n greater than the power consumption of an individual oscillator.

Provided herein are apparatus and methods for switch-coupled oscillators. In certain implementations, an oscillator system includes a primary oscillator, one or more auxiliary oscillators, one or more switching circuits, and an oscillator control circuit. The oscillator control circuit can be used to control the one or more switching circuits to selectively couple the primary oscillator to all or a portion of the one or more auxiliary oscillators. For instance, in a configuration using 2 auxiliary oscillators, the oscillator control circuit can be used to selectively couple the primary oscillator to both of the auxiliary oscillators, to one of the auxiliary oscillators, or to neither of the auxiliary oscillators. Although an example including two auxiliary oscillators has been described, the teachings herein are also applicable to configurations using a different number of auxiliary oscillators, including, for example, configurations using one auxiliary oscillator and configurations using three or more auxiliary oscillators. The oscillator control circuit can also disable any auxiliary oscillators that are decoupled from the primary oscillator to reduce power consumption.

The teachings herein can be used to provide a digitally configurable trade-off between noise performance and power consumption. For instance, in an application having relatively stringent power specifications, the oscillator control circuit can be used to decouple the primary oscillator from the auxiliary oscillators, and to disable the auxiliary oscillators to provide low power. However, when a low oscillator phase noise is desired, the oscillator control circuit can be used to couple the primary oscillator to all or a portion of the auxiliary oscillators to reduce phase noise at the expense of an increase in power consumption. By selecting a number of auxiliary oscillators to couple to the primary oscillator, a desired trade-off between phase noise and power consumption for a particular application can be achieved.

By providing an oscillator system that can be controlled in this manner, the oscillator system can be used in a variety of applications associated with different phase noise and/or power consumption specifications, while avoiding a need to manufacture different oscillator system variations suitable for use with a certain amount of phase noise or a certain amount of power consumption. For instance, an integrated circuit that includes the oscillator system can have a digitally programmable noise versus power profile which can enable the integrated circuit to be used in a wide range of applications associated with different performance specifications.

FIG. 1 is a schematic diagram of one embodiment of an oscillator system 10. The oscillator system 10 includes a primary oscillator 1, a first auxiliary oscillator 2a, a second auxiliary oscillator 2b, a third auxiliary oscillator 2c, a fourth auxiliary oscillator 2d, a fifth auxiliary oscillator 2e, a sixth auxiliary oscillator 2f, a seventh auxiliary oscillator 2g, an eighth auxiliary oscillator 2h, a ninth auxiliary oscillator 2i, a first switching circuit 3a, a second switching circuit 3b, a third switching circuit 3c, a fourth switching circuit 3d, a fifth switching circuit 3e, a sixth switching circuit 3f, a seventh switching circuit 3g, an eighth switching circuit 3h, a ninth switching circuit 3i, and an oscillator control circuit 4.

In the illustrated configuration, the first switching circuit 3a is electrically connected between the primary oscillator 1 and the first auxiliary oscillator 2a, and receives a first switch control signal from the oscillator control circuit 4. Additionally, the second switching circuit 3b is electrically connected between the primary oscillator 1 and the second auxiliary oscillator 2b, and receives a second switch control signal from the oscillator control circuit 4. Furthermore, the third switching circuit 3c is electrically connected between the primary oscillator 1 and the third auxiliary oscillator 2c, and receives a third switch control signal from the oscillator control circuit 4. Additionally, the fourth switching circuit 3d is electrically connected between the fourth auxiliary oscillator 2d and the first auxiliary oscillator 2a, and receives a fourth switch control signal from the oscillator control circuit 4. Furthermore, the fifth switching circuit 3e is electrically connected between the fifth auxiliary oscillator 2e and the second auxiliary oscillator 2b, and receives a fifth switch control signal from the oscillator control circuit 4. Additionally, the sixth switching circuit 3f is electrically connected between the sixth auxiliary oscillator 2f and the third auxiliary oscillator 2c, and receives a sixth switch control signal from the oscillator control circuit 4. Furthermore, the seventh switching circuit 3g is electrically connected between the seventh auxiliary oscillator 2g and the fourth auxiliary oscillator 2d, and receives a seventh switch control signal from the oscillator control circuit 4. Additionally, the eighth switching circuit 3h is electrically connected between the eighth auxiliary oscillator 2h and the fifth auxiliary oscillator 2e, and receives an eighth switch control signal from the oscillator control circuit 4. Furthermore, the ninth switching circuit 3i is electrically connected between the ninth auxiliary oscillator 2i and the sixth auxiliary oscillator 2f, and receives a ninth switch control signal from the oscillator control circuit 4.

The oscillator system 10 of FIG. 1 illustrates a configuration in which a primary oscillator is electrically connected to auxiliary oscillators using both parallel and series configurations. For example, in the illustrated configuration, the first auxiliary oscillator 2a, the second auxiliary oscillator 2b, and the third auxiliary oscillator 2c are electrically connected in parallel with respect to the primary oscillator 1. Additionally, the first auxiliary oscillator 2a, the fourth auxiliary oscillator 2d, and the seventh auxiliary oscillator 2g are electrically connected in series with respect to the primary oscillator 1. Similarly, the second auxiliary oscillator 2b, the fifth auxiliary oscillator 2e, and the eighth auxiliary oscillator 2h are electrically connected in series with respect to the primary oscillator 1. Similarly, the third auxiliary oscillator 2c, the sixth auxiliary oscillator 2f, and the ninth auxiliary oscillator 2i are electrically connected in series with respect to the primary oscillator 1. Oscillator systems herein can include a primary oscillator electrically connected to auxiliary oscillators using series connections, parallel connections, or a combination of series and parallel connections.

Although the oscillator system 10 illustrates a configuration using nine auxiliary oscillators, the teachings herein are applicable to configurations using more or fewer auxiliary oscillators. In one embodiment, an oscillator system includes between about 1 and about 256 auxiliary oscillators.

Although the oscillator system 10 is illustrated as including an array of auxiliary oscillators, other configurations are possible. Furthermore, although the illustrated oscillator system 10 includes 3 rows and 3 columns of auxiliary oscillators, the teachings herein are applicable to configurations including more or fewer rows and/or more or fewer columns, including, for example, implementations including one row and/or one column. Furthermore, although FIG. 1 illustrates a configuration in which each row of auxiliary oscillators includes an equal number of auxiliary oscillators, the teachings herein are applicable to configurations in which a different number of auxiliary oscillators are included in all or part of the rows.

In the illustrated configuration, the oscillator control circuit 4 generates the first to ninth switch control signals for the first to ninth switching circuits 3a-3i, respectively. Although the oscillator control circuit 4 is illustrated as providing a single control signal to each switching circuit, the teachings herein are applicable to configurations in which oscillator control circuit 4 provides multiple control signals to one or more switching circuits.

The oscillator control circuit 4 further generates a first power control signal for the first auxiliary oscillator 2a, a second power control signal for the second auxiliary oscillator 2b, a third power control signal for the third auxiliary oscillator 2c, a fourth power control signal for the fourth auxiliary oscillator 2d, a fifth power control signal for the fifth auxiliary oscillator 2e, a sixth power control signal for the sixth auxiliary oscillator 2f, a seventh power control signal for the seventh auxiliary oscillator 2g, an eighth power control signal for the eighth auxiliary oscillator 2h, and a ninth power control signal for the ninth auxiliary oscillator 2i. The first to ninth power control signals can be used, for example, to individually disable or enable the first to ninth auxiliary oscillators 2a-2i, respectively. In certain configurations, the first to ninth power control signals can be used to disable or enable a particular auxiliary oscillator by turning on or off one or more amplification circuits of the auxiliary oscillator to suppress or eliminate oscillations. However, other ways of disabling/enabling are also applicable.

Although FIG. 1 illustrates the first to ninth switch control signals and the first to ninth power control signals as eighteen separate signals, in certain configurations, switch control signals and/or power control signals can be shared amongst two or more of the auxiliary oscillators. Furthermore, in certain configurations a switch control signal can also be used as a power control signal. For instance, in one embodiment, the first switch control signal is used to open or close the first switching circuit 3a and to disable or enable the first auxiliary oscillator 2a. Likewise, in certain configurations, the second to ninth switch control signals can be used to open or close the second to ninth switching circuits 3b-3i, respectively, and to disable or enable the second to ninth auxiliary oscillators 2b-2i, respectively. Configuring an oscillator system to share switch control signals and power control signals can reduce an amount of signal routing.

The primary oscillator 1 and the auxiliary oscillators 2a-2i can be implemented using a wide variety of types of oscillators, including, for example, inductor-capacitor (LC) tank oscillators, ring oscillators, or rotary travelling wave oscillators (RTWOs).

The oscillator control circuit 4 can be used to selectively couple none, a portion of, or all of the first to ninth auxiliary oscillators 2a-2i to the primary oscillator 1 using the first to ninth switching circuits 3a-3i, respectively. For example, to achieve a relatively small amount of power consumption at the expense of an increase in noise, the oscillator control circuit 4 can disable the first to ninth auxiliary oscillators 2a-2i and decouple the first to ninth auxiliary oscillators 2a-2i from the primary oscillator 1 using the first to ninth switching circuits 3a-3i. Configuring the oscillator system 10 in this manner can decrease power consumption, but increase phase noise of an oscillator signal generated by the primary oscillator 1. Additionally, to achieve lower phase noise with a corresponding increase in power consumption, the oscillator control circuit 4 can be used to enable one or more of the auxiliary oscillators 2a-2i using the first to ninth power control signals, respectively. Furthermore, the oscillator control circuit 4 can use the first to ninth switch control signals to control the first to ninth switching circuits 3a-3i, respectively, to couple any enabled auxiliary oscillators to the primary oscillator 1 and to decouple any disabled auxiliary oscillators from the primary oscillator 1.

Accordingly, the oscillator system 10 can be used to provide a desired trade-off between noise performance and power consumption, which can be digitally selectable in certain embodiments. Thus, the illustrated oscillator system 10 has a controllable phase noise versus power consumption. Configuring the oscillator system 10 in this manner permits the oscillator system 10 to be used in a variety of applications associated with different phase noise or power consumption specifications, which in turn can reduce manufacturing and/or design costs by avoiding a need to manufacture separate oscillator systems for each application having a particular phase noise or power consumption specification.

In one embodiment, the oscillator control circuit 4 includes a programmable memory, and the determination of which auxiliary oscillators are enabled and coupled to the primary oscillator 1 or disabled and decoupled from the primary oscillator 1 is based on data stored in the programmable memory. For example, in certain configurations, the programmable memory can be a volatile memory programmed to include data corresponding to the selected oscillator configuration during power-up or turn-on and/or programmed with the data during operation. In other configurations, the programmable memory can be a non-volatile memory, including, for example, a flash memory, a read-only memory (ROM), and/or a memory implemented using fuses and/or anti-fuses, and the non-volatile memory can be programmed with the data during manufacture. In such a configuration, an integrated circuit including the oscillator system 10 can be used in a variety of different applications by programming the programmable memory with a certain oscillator configuration suitable for a particular application.

Figure 2A:
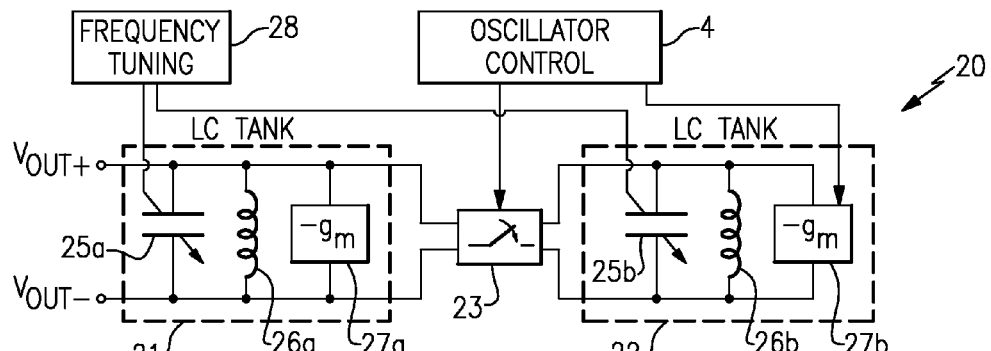
FIG. 2A is a schematic diagram of one embodiment of an inductor-capacitor (LC) tank oscillator system.

FIG. 2A is a schematic diagram of one embodiment of an inductor-capacitor (LC) tank oscillator system 20. The LC tank oscillator system 20 includes the oscillator control circuit 4, which can be as described earlier. The LC tank oscillator system 20 further includes a primary LC tank oscillator 21, an auxiliary LC tank oscillator 22, a switching circuit 23, and a frequency tuning circuit 28.

The primary LC tank oscillator 21 includes a first variable capacitor 25a, a first inductor 26a, and a first negative transconductance circuit 27a, which are electrically connected in parallel between a first node and a second node, which serve as the oscillator system's non-inverted output voltage terminal $V_{OUT+}$ and inverted output voltage terminal $V_{OUT-}$, respectively. Additionally, the auxiliary LC tank oscillator 22 includes a second variable capacitor 25b, a second inductor 26b, and a second negative transconductance circuit 27b, which are electrically connected in parallel between a first node and a second node of the auxiliary LC tank oscillator 22.

Although the illustrated LC tank oscillator system 20 includes one auxiliary LC tank oscillator, the LC tank oscillator system 20 can be adapted to include additional auxiliary LC tank oscillators and corresponding switching circuits. Such auxiliary LC tank oscillators can be provided in a series configuration, a parallel configuration, or a combination thereof.

As shown in FIG. 2A, the frequency tuning circuit 28 is configured to generate a first capacitance control signal for controlling a capacitance of the first variable capacitor 25a and a second capacitance control signal for controlling a capacitance of the second variable capacitor 25b. Although FIG. 2A illustrates the first and second variable capacitors 25a, 25b as receiving different capacitance control signals, other configurations are possible, such as implementations in which the first and second variable capacitors 25a, 25b receive a common capacitance control signal.

The frequency tuning circuit 28 can be used to control an oscillation frequency of the primary LC tank oscillator 21 and the auxiliary LC tank oscillator 22 by adjusting the capacitances of the first and second variable capacitors 25a, 25b. The first and second variable capacitors 25a, 25b can be implemented in a variety of ways, such as by using analog-controlled capacitors, digitally-controlled capacitors, or a combination thereof. For example, in one embodiment, the first and second variable capacitors 25a, 25b each include a digitally-controlled capacitor array for providing coarse frequency tuning and an analog-controlled varactor for providing fine frequency tuning.

As shown in FIG. 2A, the switching circuit 23 has been electrically connected between the primary LC tank oscillator 21 and the auxiliary LC tank oscillator 22. In the illustrated configuration, when the switching circuit 23 is closed, the switching circuit 23 can electrically connect the primary LC tank oscillator's first node to the auxiliary LC tank oscillator's first node and electrically connect the primary LC tank oscillator's second node to the auxiliary LC tank oscillator's second node. Electrically connecting a switching circuit between two or more nodes of a primary oscillator and two or more corresponding nodes of an auxiliary oscillator can provide robust coupling when the switching circuit is closed. However, other configurations are possible.

The illustrated oscillator control circuit 4 generates a switch control signal for opening or closing the switching circuit 23. The switch control signal can be used to couple or decouple the primary LC tank oscillator 21 and the auxiliary LC tank oscillator 22. The oscillator control circuit 4 also generates a power control signal, which has been provided to the second negative transconductance circuit 27b of the auxiliary LC tank oscillator 22. The power control signal can be used to enable or disable the auxiliary LC tank oscillator 22.

The illustrated LC tank oscillator system 20 illustrates one example of an oscillator system in accordance with the teachings herein. However, the teachings herein are applicable to configurations, such as implementations using different types of oscillators and/or configurations including one or more additional auxiliary oscillators. Additional details of the LC tank oscillator system 20 can be as described earlier.

Figure 2B:
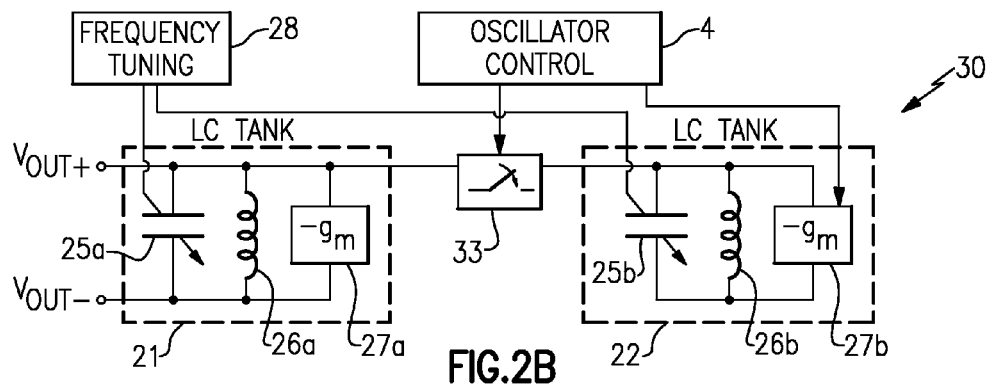
FIG. 2B is a schematic diagram of another embodiment of an LC tank oscillator system.

FIG. 2B is a schematic diagram of another embodiment of an LC tank oscillator system 30. The LC tank oscillator system 30 is similar to the LC tank oscillator system 20 of FIG. 2A, except that the LC tank oscillator system includes a different implementation of a switching circuit 33. For example, in contrast to the switching circuit 23 of FIG. 2A that is electrically connected between a pair of nodes of the primary LC tank oscillator 21 and a pair of nodes of the auxiliary LC tank oscillator 22, the switching circuit 33 of FIG. 2B is electrically connected between a single node of the primary LC tank oscillator 21 and a single node of the auxiliary LC tank oscillator 22.

The switching configuration shown in FIG. 2B can be used in a variety of configurations, including, for example, implementations using single-ended oscillators. For example, a primary oscillator and an auxiliary oscillator can each include a single-ended output that is referenced to a reference voltage, such as a power low or ground supply. In such configurations, the primary oscillator and the auxiliary oscillator can be electrically coupled to one another through the single-ended outputs.

Additional details of the LC tank oscillator system 30 can be similar to those described earlier for the LC tank oscillator system 20.

Figure 2C:
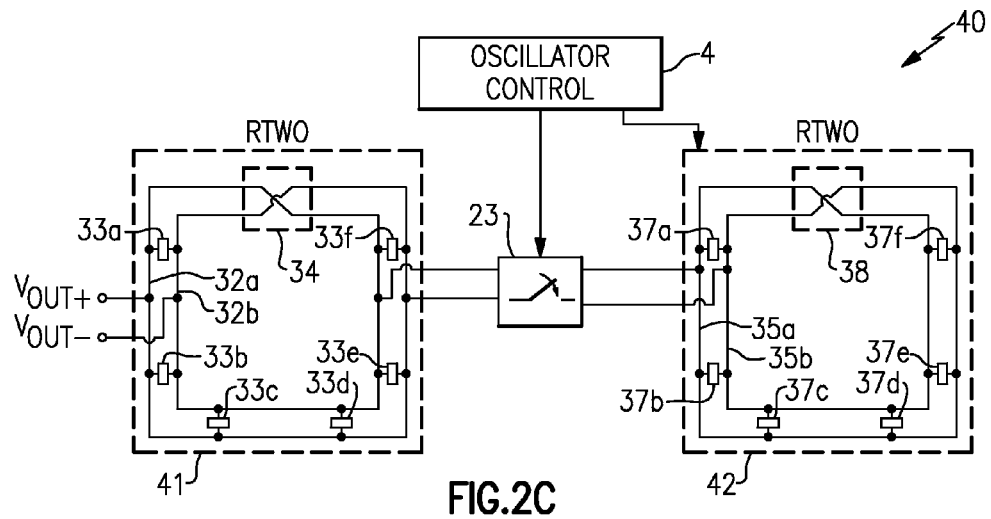
FIG. 2C is a schematic diagram of one embodiment of a rotary traveling wave oscillator (RTWO) system.

FIG. 2C is a schematic diagram of one embodiment of a rotary traveling wave oscillator (RTWO) system 40. The RTWO system 40 includes the oscillator control circuit 4 and the switching circuit 23, which can be as described earlier. The RTWO system 40 further includes a primary RTWO 41 and an auxiliary RTWO 42.

The primary RTWO 41 includes a first differential transmission line including a first conductor 32a and a second conductor 32b. The primary RTWO 41 further includes a cross-over 34 and first to sixth regeneration circuits 33a-33f. The auxiliary RTWO 42 includes a second differential transmission line including a first conductor 35a and a second conductor 35b. The auxiliary RTWO 42 further includes a cross-over 38 and first to sixth regeneration circuits 37a-37f.

As persons having ordinary skill in the art will appreciate, an RTWO can include a differential transmission line connected in a closed loop, an odd number of one or more cross-overs, and a plurality of regeneration circuits electrically connected along a path of the differential transmission line. Additionally, each of the cross-overs can reverse the polarity of a wave propagating along the differential transmission line, and the regeneration circuits can provide energy to the wave to compensate for the differential transmission line's losses. Additional details of RTWOs can be as described in commonly-owned U.S. Pat. No. 6,556,089, issued Apr. 29, 2003, and titled "ELECTRONIC CIRCUITRY," which is hereby incorporated by reference in its entirety herein.

In the illustrated configuration, the primary RTWO 41 and the auxiliary RTWO 42 each include one cross-over and six regeneration circuits. However, other configurations are possible, including, for example, configurations using a different number of cross-overs and/or more or fewer regeneration circuits. Furthermore, although FIG. 2C illustrates an oscillator system including one auxiliary RTWO, the RTWO system 40 can be adapted to include additional auxiliary RTWOs and/or other circuitry.

As shown in FIG. 2C, the switching circuit 23 receives a switch control signal, which can be used to selectively couple or decouple the primary RTWO 41 to the auxiliary RTWO 42. When the switching circuit 23 is closed, the switching circuit 23 differentially connects the primary RTWO 41 to the auxiliary RTWO 42 by connecting the primary RTWO's first conductor 32a to the auxiliary RTWO's first conductor 35a and by connecting the primary RTWO's second conductor 32b to the auxiliary RTWO's second conductor 35b.

The illustrated switching circuit 23 further generates a power control signal, which has been provided to the auxiliary RTWO 42. The power control signal can be used to selectively enable or disable the auxiliary RTWO 42 to save power when the auxiliary RTWO 42 is decoupled from the primary RTWO 41. In one embodiment, the power control signal can be used to enable or disable the first to sixth regeneration circuits 37a-37f of the auxiliary RTWO 42. However, the auxiliary RTWO 42 can be enabled or disabled using the power control signal in other ways.

The illustrated RTWO system 40 illustrates another example of an oscillator system in accordance with the teachings herein. However, the teachings herein are applicable to configurations, such as implementations using other types of oscillators and/or configurations including one or more additional auxiliary oscillators.

FIGS. 3A-6 illustrate oscillator systems including switching circuits according to various embodiments. Although several embodiments of switching circuits will be described below, the teachings herein are applicable to other configurations of switching circuits. Although illustrated in the context of being electrically connected between a primary oscillator and an auxiliary oscillator, the switching circuits can likewise be used to electrically connect one auxiliary oscillator to another auxiliary oscillator.

Figure 3A:
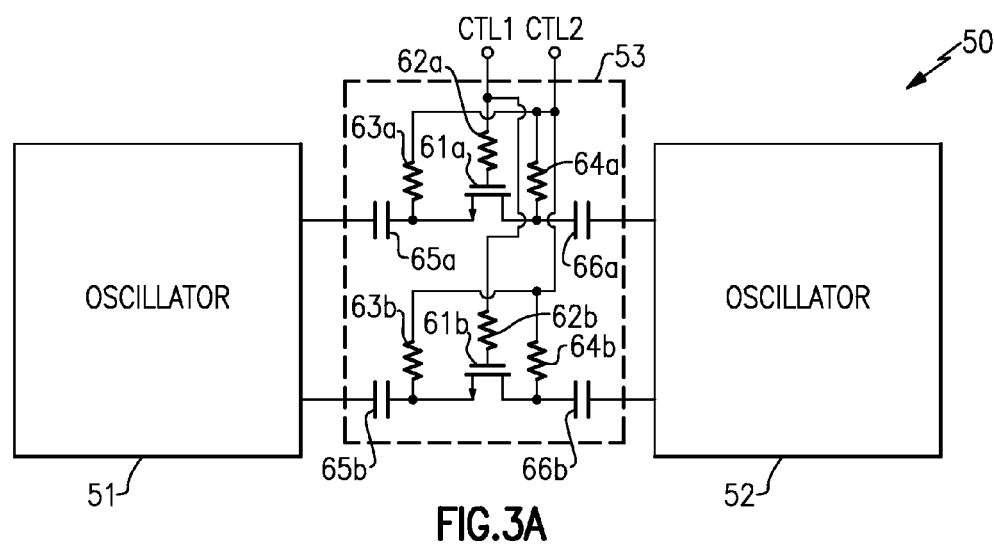
FIG. 3A is a schematic diagram of an oscillator system including a switching circuit according to one embodiment.

FIG. 3A is a schematic diagram of an oscillator system 50 including a switching circuit 53 according to one embodiment. The oscillator system 50 includes a primary oscillator 51, an auxiliary oscillator 52, and the switching circuit 53.

The switching circuit 53 includes a first n-type metal oxide semiconductor (NMOS) transistor 61a, a second NMOS transistor 61b, a first source coupling capacitor 65a, a second source coupling capacitor 65b, a first drain coupling capacitor 66a, a second drain coupling capacitor 66b, a first gate biasing resistor 62a, a second gate biasing resistor 62b, a first source biasing resistor 63a, a second source biasing resistor 63b, a first drain biasing resistor 64a, and a second drain biasing resistor 64b.

As used herein and as persons having ordinary skill in the art will appreciate, MOS transistors can also have gates made out of materials that are not metals, such as poly silicon, and can have dielectric regions implemented not just with silicon oxide, but with other dielectrics, such as high-k dielectrics. Although FIG. 3A illustrates a configuration including NMOS transistors, the teachings herein are applicable to configurations using other types of switch structures. For example, in certain configurations, a switching circuit can include other types of field-effect transistors (FETs) or other switching structures, such as microelectromechanical systems (MEMS) switches. Furthermore, although FIG. 3A illustrates a configuration using n-type devices, the teachings herein are applicable to configurations using p-type devices, or a combination of n-type and p-type devices.

In the illustrated configuration, the first source coupling capacitor 65a is electrically connected between a first node of the primary oscillator 51 and the source of the first NMOS transistor 61a. Additionally, the first drain coupling capacitor 66a is electrically connected between a drain of the first NMOS transistor 61a and a first node of the auxiliary oscillator 52. Furthermore, the second source coupling capacitor 65b is electrically connected between a second node of the primary oscillator 51 and a source of the second NMOS transistor 61b. Additionally, the second drain coupling capacitor 66b is electrically connected between a drain of the second NMOS transistor 61b and a second node of the auxiliary oscillator 52.

The first and second source coupling capacitors 65a, 65b and the first and second drain coupling capacitors 66a, 66b can provide low impedance to high frequency oscillator signals generated by the primary oscillator 51 and the auxiliary oscillator 52, and thus the primary oscillator 51 and the auxiliary oscillator 52 can be coupled to one another when the first and second NMOS transistors 61a, 61b are turned on. However, the first and second source coupling capacitors 65a, 65b and the first and second drain coupling capacitors 66a, 66b can provide high impedance to DC signals, and thus can serve as DC blocking capacitors.

Including the first and second source coupling capacitors 65a, 65b and the first and second drain coupling capacitors 66a, 66b can aid in biasing the first and second NMOS transistors 61a, 61b at different bias voltages relative to the bias voltages of the primary oscillator 51 and the auxiliary oscillator 52. Biasing the first and second NMOS transistors 61a, 61b in this manner can aid in protecting the transistors from overvoltage conditions when the primary oscillator 51 and the auxiliary oscillator 52 oscillate with a relatively large amplitude or swing.

Additionally, biasing the first and second NMOS transistors 61a, 61b in this manner can help make the transistors' drain and/or source voltages independent of the oscillator DC bias voltages, which can aid in turning the switching circuit 53 on or off. For instance, when the DC voltage level of an oscillator is at a ground voltage, including source and drain coupling capacitors can avoid a need to turn off the first and second NMOS transistors 61a, 61b by biasing the transistors' gates with a voltage below ground, which may be cumbersome from a design perspective.

The first gate biasing resistor 62a includes a first end that receives a first switch control signal CTL1 and a second end electrically connected to a gate of the first NMOS transistor 61a. Additionally, the second gate biasing resistor 62b includes a first end that receives the first switch control signal CTL1 and a second end electrically connected to a gate of the second NMOS transistor 61b. The first switch control signal CTL1 can be generated by an oscillator control circuit, such as the oscillator control circuit 4 shown in FIGS. 1-2C.

Including the first and second gate biasing resistors 62a, 62b can enhance isolation between the switching circuit 53 and an oscillator control circuit that generates the first switch control signal CTL1. For example, high frequency signal components can be coupled onto the gates of the first and second NMOS transistors 61a, 61b via parasitic gain-to-drain and/or gate-to-source capacitances, and the first and second gate biasing resistors 62a, 62b can provide resistance that impedes the high frequency signal components from reaching the oscillator control circuit.

Additionally, the first and second gate biasing resistors 62a, 62b can help maintain a substantially constant DC voltage from gate-to-source and/or gate-to-drain, even as the drain and/or source voltages change in the presence of AC signals. Configuring the switching circuit 53 in this manner can help prevent damage to MOS transistors, and to help assure the switching circuit 53 remains on or off in the presence of oscillations. For example, including the first and second gate biasing resistors 62a, 62b can help the gate voltages of the first and second NMOS transistors 61a, 61b to track voltage changes in the transistors' drain and/or source voltages, thereby maintaining substantially constant gate-to-drain and/or gate-to-source DC voltages.

The first source biasing resistor 63a includes a first end that receives a second switch control signal CTL2 and a second end electrically connected to the source of the first NMOS transistor 61a. The first drain biasing resistor 64a includes a first end that receives the second switch control signal CTL2 and a second end electrically connected to the drain of the first NMOS transistor 61a. The second source biasing resistor 63b includes a first end that receives the second switch control signal CTL2 and a second end electrically connected to the source of the second NMOS transistor 61b. The second drain biasing resistor 64b includes a first end that receives the second switch control signal CTL2 and a second end electrically connected to the drain of the second NMOS transistor 61b. The first and second source biasing resistors 63a, 63b and the first and second drain biasing resistors 64a, 64b can enhance isolation between the switching circuit 53 and an oscillator control circuit that generates the second switch control signal CTL2.

The first and second control signals CTL1, CTL2 can be controlled to turn on (close) or turn off (open) the switching circuit 53, thereby selectively coupling or decoupling the primary oscillator 51 to the auxiliary oscillator 52. For example, the voltage level of the first switch control signal CTL1 can be controlled to turn on or off the first and second NMOS transistors 61a, 61b. Additionally, the voltage level of the second switch control signal CTL2 can be controlled to bias the drains and sources of the first and second NMOS transistors 61a, 61b to suitable voltage levels associated with opening or closing the switching circuit 53.

Although FIG. 3A illustrates a configuration including the second switch control signal CTL2, in certain implementations, the second switch control signal CTL2 can be omitted in favor of using a DC bias voltage having about the same voltage level when the switching circuit 53 is opened or closed. However, using the second switch control signal CTL2 to bias the sources and drains of the first and second NMOS transistors 61a, 61b to different voltage levels depending on whether the switching circuit 53 is opened or closed can provide a variety of advantages, including, for example, helping to prevent overvoltage conditions on the first and second NMOS transistors 61a, 61b and/or helping to maintain substantially constant DC bias voltages.

Figure 3B:
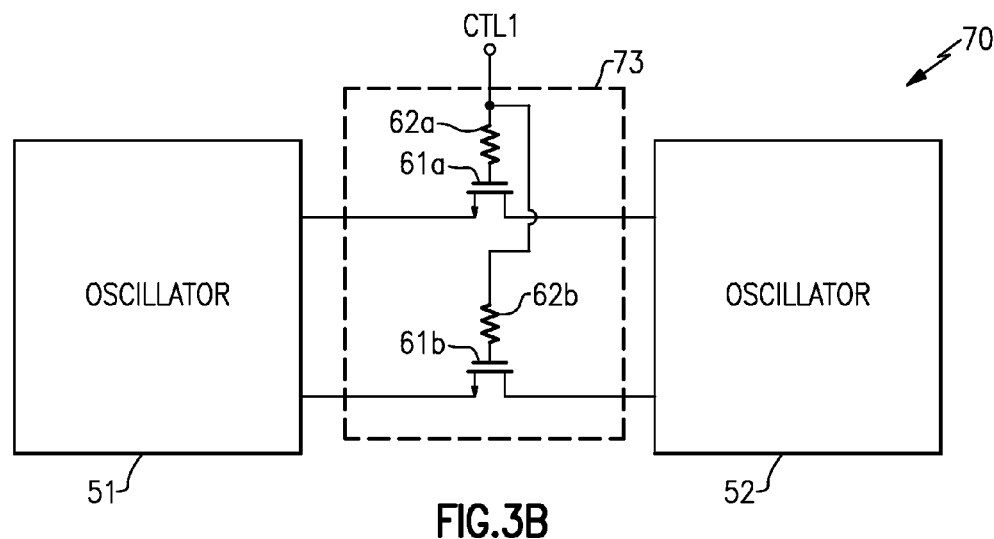
FIG. 3B is a schematic diagram of an oscillator system including a switching circuit according to another embodiment.

FIG. 3B is a schematic diagram of an oscillator system 70 including a switching circuit 73 according to another embodiment. The oscillator system 70 of FIG. 3B is similar to the oscillator system 50 of FIG. 3A, except that the oscillator system 70 includes a different configuration of a switching circuit.

For example, in contrast to the switching circuit 53 of FIG. 3A, the switching circuit 73 of FIG. 3B omits the first and second source coupling capacitors 65*a*, 65*b*, the first and second drain coupling capacitors 66*a*, 66*b*, the first and second source biasing resistors 63*a*, 63*b*, and the first and second drain biasing resistors 64*a*, 64*b*. Additionally, in contrast to the switching circuit 53 of FIG. 3A, the switching circuit 73 of FIG. 3B operates without using the second switch control signal CTL2.

The illustrated switching circuit 73 can be used, for example, in configurations in which DC bias voltages of the primary oscillator 51 and the auxiliary oscillator 52 are also suitable for biasing the sources and drains of the first and second NMOS transistors 61*a*, 61*b*.

In one embodiment, the first and second NMOS transistors 61*a*, 61*b* are omitted in favor of including first and second PMOS transistors. For example, using PMOS transistors may be more suitable than using NMOS transistors in configurations in which the DC bias voltages of the primary oscillator 51 and auxiliary oscillator 52 are relatively high.

Additional details of the oscillator system 70 of FIG. 3B can be similar to those described earlier.

Figure 4:
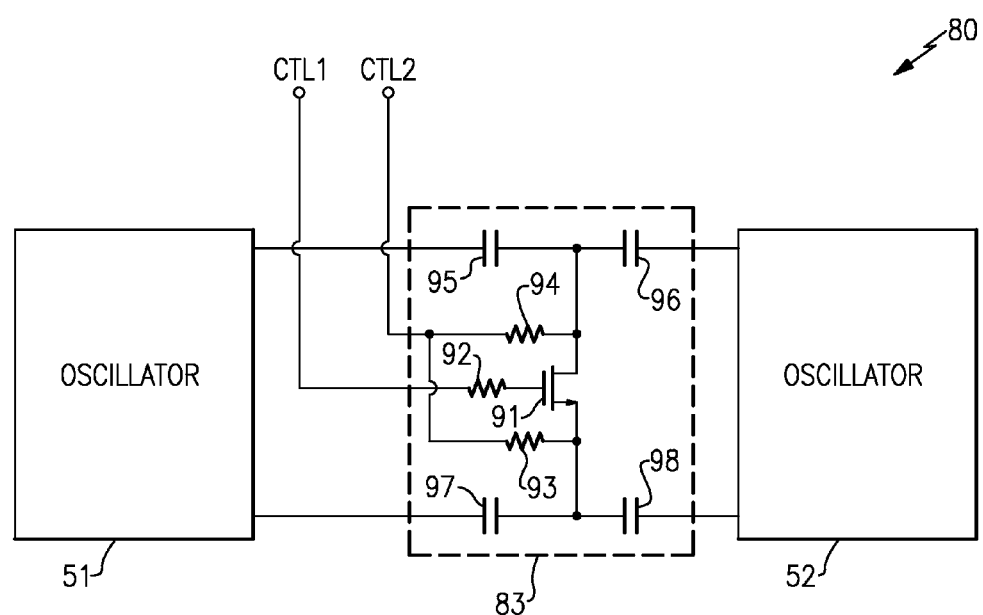
FIG. 4 is a schematic diagram of an oscillator system including a switching circuit according to another embodiment.

FIG. 4 is a schematic diagram of an oscillator system 80 including a switching circuit 83 according to another embodiment.

The oscillator system 80 of FIG. 4 is similar to the oscillator system 50 of FIG. 3A, except that the oscillator system 80 includes a different configuration of a switching circuit. For example, the switching circuit 83 of FIG. 4 includes an NMOS transistor 91, a gate biasing resistor 92, a source biasing resistor 93, a drain biasing resistor 94, a first drain coupling capacitor 95, a second drain coupling capacitor 96, a first source coupling capacitor 97, and a second source coupling capacitor 98.

In the illustrated configuration, the first drain coupling capacitor 95 is electrically connected between a first node of the primary oscillator 51 and a drain of the NMOS transistor 91. Additionally, the second drain coupling capacitor 96 is electrically connected between a first node of the auxiliary oscillator 52 and the drain of the NMOS transistor 91. Furthermore, the first source coupling capacitor 97 is electrically connected between a second node of the primary oscillator 51 and a source of the NMOS transistor 91. Additionally, the second source coupling capacitor 98 is electrically connected between a second node of the auxiliary oscillator 52 and the source of the NMOS transistor 91. Furthermore, the gate biasing resistor 92 includes a first end that receives a first switch control signal CTL1, and a second end electrically connected to a gate of the NMOS transistor 91. Additionally, the drain biasing resistor 94 includes a first end that receives a second switch control signal CTL2 and a second end electrically connected to the drain of the NMOS transistor 91. Furthermore, the source biasing resistor 93 includes a first end that receives the second switch control signal CTL2 and a second end electrically connected to the source of the NMOS transistor 91.

When the NMOS transistor 91 is turned off, the primary oscillator 51 can be coupled to the auxiliary oscillator 52 through the first and second drain coupling capacitors 95, 96 and the first and second source coupling capacitors 97, 98. However, when the NMOS transistor 91 is turned on, the primary oscillator 51 can be decoupled from the auxiliary oscillator 52, since the NMOS transistor 91 can operate as a shunt. Additional details of the oscillator system 80 can be similar to those described earlier.

Figure 5A:
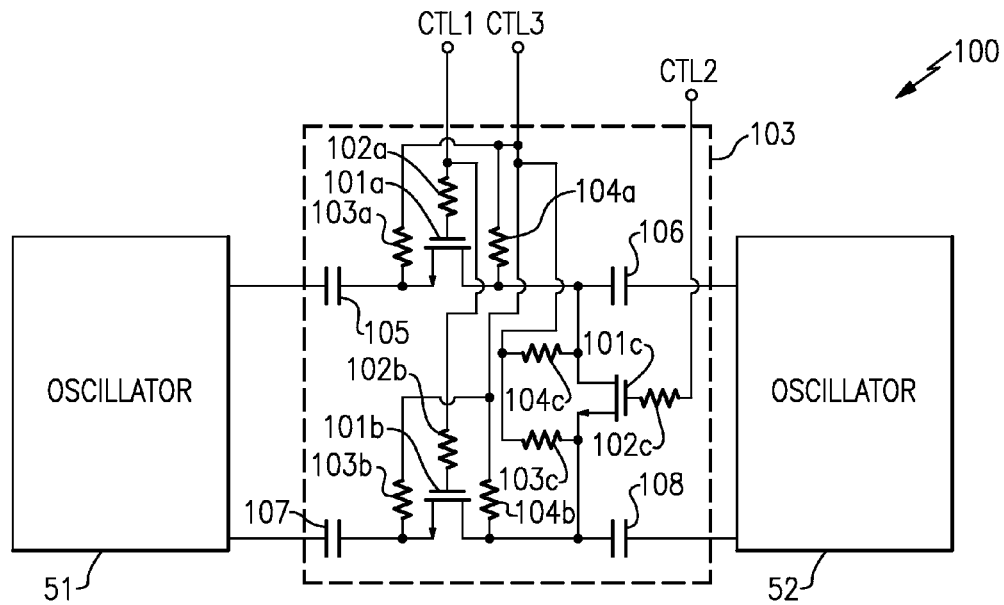
FIG. 5A is a schematic diagram of an oscillator system including a switching circuit according to another embodiment.

FIG. 5A is a schematic diagram of an oscillator system 100 including a switching circuit 103 according to another embodiment. The oscillator system 100 of FIG. 5A is similar to the oscillator system 50 of FIG. 3A, except that the oscillator system 100 includes a different configuration of a switching circuit. For example, the switching circuit 103 of FIG. 5A includes a first NMOS transistor 101*a*, a second NMOS transistor 101*b*, a third NMOS transistor 101*c*, a first gate biasing resistor 102*a*, a second gate biasing resistor 102*b*, a third gate biasing resistor 102*c*, a first source biasing resistor 103*a*, a second source biasing resistor 103*b*, a third source biasing resistor 103*c*, a first drain biasing resistor 104*a*, a second drain biasing resistor 104*b*, a third drain biasing resistor 104*c*, a first coupling capacitor 105, a second coupling capacitor 106, a third coupling capacitor 107, and a fourth coupling capacitor 108.

In the illustrated configuration, the first coupling capacitor 105 is electrically connected between a first node of the primary oscillator 51 and a source of the first NMOS transistor 101*a*. Additionally, the second coupling capacitor 106 is electrically connected between a first node of the auxiliary oscillator 52 and a drain of the first NMOS transistor 101*a*. Furthermore, the third coupling capacitor 107 is electrically connected between a second node of the primary oscillator 51 and a source of the second NMOS transistor 101*b*. Additionally, the fourth coupling capacitor 108 is electrically connected between a second node of the auxiliary oscillator 52 and a drain of the second NMOS transistor 101*b*. Furthermore, the third NMOS transistor 101*c* includes a drain electrically connected to the drain of the first NMOS transistor 101*a* and a source electrically connected to the drain of the second NMOS transistor 101*b*. The first gate biasing resistor 102*a* includes a first end that receives a first switch control signal CTL1 and a second end electrically connected to a gate of the first NMOS transistor 101*a*. Additionally, the second gate biasing resistor 102*b* includes a first end that receives the first switch control signal CTL1 and a second end electrically connected to a gate of the second NMOS transistor 101*b*. Furthermore, the third gate biasing resistor 102*c* includes a first end that receives a second switch control signal CTL2 and a second end electrically connected to a gate of the third NMOS transistor 101*c*.

The first source biasing resistor 103*a* includes a first end that receives a third switch control signal CTL3 and a second end electrically connected to the source of the first NMOS transistor 101*a*. Additionally, the second source biasing resistor 103*b* includes a first end that receives the third switch control signal CTL3 and a second end electrically connected to the source of the second NMOS transistor 101*b*. Furthermore, the third source biasing resistor 103*c* includes a first end that receives the third switch control signal CTL3 and a second end electrically connected to the source of the third NMOS transistor 101*c*. Additionally, the first drain biasing resistor 104*a* includes a first end that receives the third switch control signal CTL3 and a second end electrically connected to the drain of the first NMOS transistor 101*a*. Furthermore, the second drain biasing resistor 104*b* includes a first end that receives the third switch control signal CTL3 and a second end electrically connected to the drain of the second NMOS transistor 101*b*. Additionally, the third drain biasing resistor 104*c* includes a first end that receives the third switch control signal CTL3 and a second end electrically connected to the drain of the third NMOS transistor 101*c*.

The first to third switch control signals CTL1-CTL3 can be controlled to open or close the switching circuit 103. When the switching circuit 103 is closed, the first and second NMOS transistors 101a, 101b can be turned on and the third NMOS transistor 101c can be turned off. In such a configuration, the primary oscillator 51 and the auxiliary oscillator 52 can be coupled to one another through the first to fourth coupling capacitors 105-108. When the switching circuit is opened, the first and second NMOS transistors 101a, 101b can be turned off and the third NMOS transistor 101c can be turned on. In such a configuration, the first and second NMOS transistors 101a, 101b can have high channel impedance, which can operate to decouple the primary oscillator 51 from the auxiliary oscillator 52. Additionally, the third NMOS transistor 101c can operate as a shunt that can help further decouple the oscillators.

In the illustrated configuration, the first switch control signal CTL1 can be used to control the gate voltages of the first and second NMOS transistors 101a, 101b, and the second switch control signal CTL2 can be used to control the gate voltage of the third NMOS transistor 101c. Additionally, the third switch control signal CTL3 can be used to control the source and drain voltages of the first to third NMOS transistors 101a-101c. The third switch control signal CTL3 can be used to bias the source and drain voltages to suitable voltage levels when the switching circuit 103 is opened or closed. However, other configurations are possible.

Figure 5B:
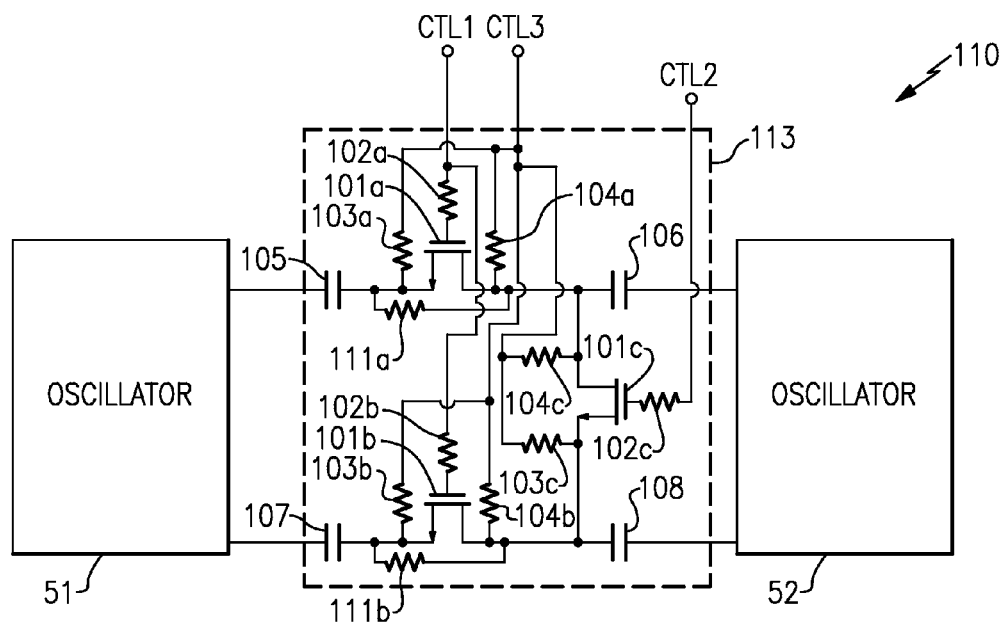
FIG. 5B is a schematic diagram of an oscillator system including a switching circuit according to another embodiment.

FIG. 5B is a schematic diagram of an oscillator system 110 including a switching circuit 113 according to another embodiment. The oscillator system 110 of FIG. 5B is similar to the oscillator system 100 of FIG. 5A, except that the oscillator system 110 includes a different configuration of a switching circuit.

The switching circuit 113 of FIG. 5B is similar to the switching circuit 103 of FIG. 5A, except that the switching circuit 113 further includes a first dampening resistor 111a and a second dampening resistor 111b. The first dampening resistor 111a includes a first end electrically connected to the source of the first NMOS transistor 101a and a second end electrically connected to the drain of the first NMOS transistor 101a, and is in parallel with the first NMOS transistor's channel. Additionally, the second dampening resistor 111b includes a first end electrically connected to the source of the second NMOS transistor 101b and a second end electrically connected to the drain of the second NMOS transistor 101b, and is in parallel with the second NMOS transistor's channel.

Including the first and second dampening resistors 111a, 111b can aid in preventing the first and third coupling capacitors 105, 107 from loading the primary oscillator 51 when the primary oscillator 51 and the auxiliary oscillator 52 are decoupled.

Additional details of the oscillator system 110 can be as described earlier.

Figure 6:
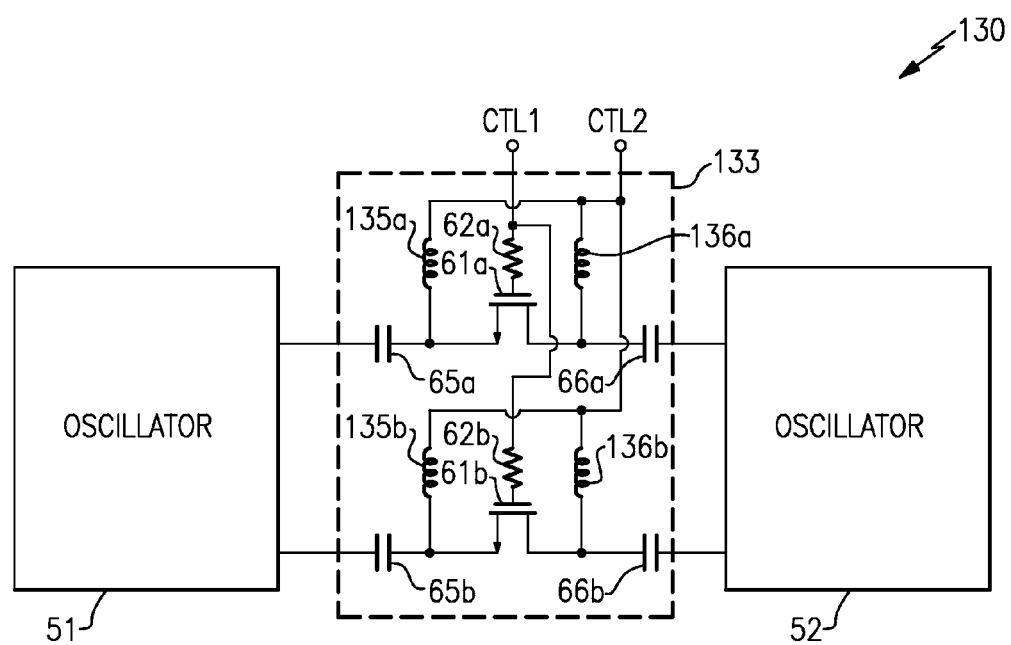
FIG. 6 is a schematic diagram of an oscillator system including a switching circuit according to another embodiment.

FIG. 6 is a schematic diagram of an oscillator system 130 including a switching circuit 133 according to another embodiment. The oscillator system 130 of FIG. 6 is similar to the oscillator system 50 of FIG. 3A, except that the oscillator system 130 includes a different configuration of a switching circuit.

For example, in contrast to the switching circuit 53 of FIG. 3A, the switching circuit 133 of FIG. 6 omits the first and second source biasing resistors 63a, 63b in favor of including the first and second source biasing inductors 135a, 135b. Additionally, in contrast to the switching circuit 53 of FIG. 3A, the switching circuit 133 of FIG. 6 omits the first and second drain biasing resistors 64a, 64b in favor of including the first and drain biasing inductors 136a, 136b.

The switching circuits herein can be biased in a variety of ways. Although the switching circuits illustrated in FIGS. 3A-5 including transistors having gates, sources, and drains biased using resistors, other configurations are possible. For example, inductors and/or other circuitry can be used to provide biasing.

Additionally, in certain embodiments, a gate of a transistor of a switching circuit can be biased directly with a switch control signal without intervening resistors or inductors. For example, when a transistor's source and drain receive oscillator signals that are differential, such as in shunt transistor configurations, the transistor's gate can operate as a differential ground. In one embodiment, the gate biasing resistor 92 of the switching circuit 83 of FIG. 4 is omitted. In another embodiment, the third gate biasing resistor 102c of the switching circuit 103 of FIG. 5A is omitted. In yet another embodiment, the third gate biasing resistor 102c of the switching circuit 113 of FIG. 5B is omitted.

Figure 7A:
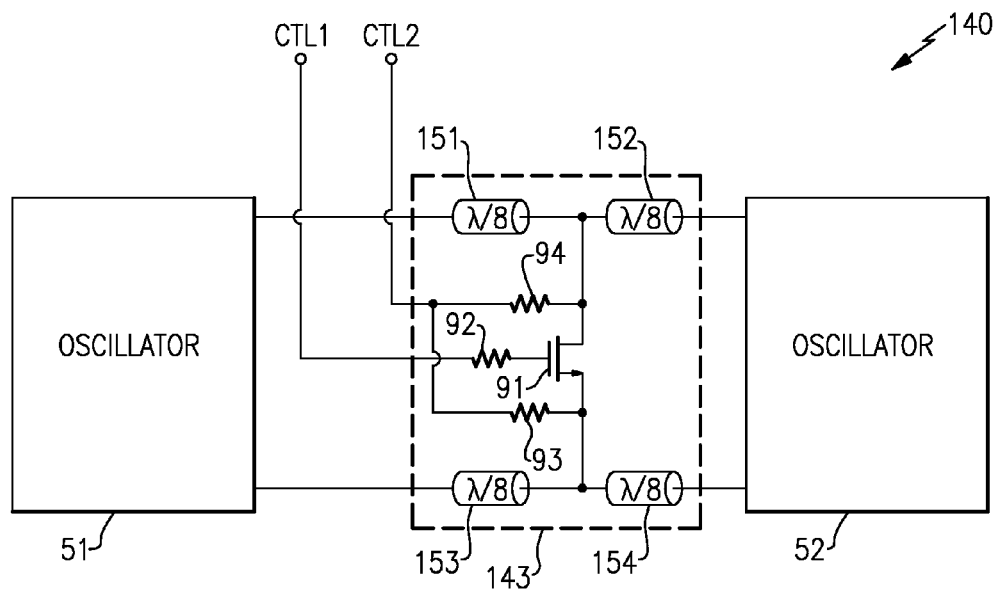
FIG. 7A is a schematic diagram of an oscillator system including a switching circuit according to another embodiment.

FIG. 7A is a schematic diagram of an oscillator system 140 including a switching circuit 143 according to another embodiment. The oscillator system 140 of FIG. 7A is similar to the oscillator system 80 of FIG. 4, except that the oscillator system 140 includes a different configuration of a switching circuit.

For example, in contrast to the switching circuit 83 of FIG. 4, the switching circuit 143 of FIG. 7A omits the decoupling capacitors 95-98 in favor of including first to fourth transmission lines 151-154, respectively. The first transmission line 151 includes a first end electrically connected to a first node of the primary oscillator 51 and a second end electrically connected to a drain of the NMOS transistor 91. Additionally, the second transmission line 152 includes a first end electrically connected to the drain of the NMOS transistor 91 and a second end electrically connected to a first node of the auxiliary oscillator 52. Furthermore, the third transmission line 153 includes a first end electrically connected to a second node of the primary oscillator 51 and a second end electrically connected to a source of the NMOS transistor 91. Additionally, the fourth transmission line 154 includes a first end electrically connected to the source of the NMOS transistor 91 and a second end electrically connected to a second node of the auxiliary oscillator 52.

When the NMOS transistor 91 is turned off, the first to fourth transmission lines 151-154 can couple the primary oscillator 51 to the auxiliary oscillator 52. However, when the NMOS transistor 92 is turned on, the primary oscillator 51 and the auxiliary oscillator 52 can be decoupled from one another. For example, the short circuit from the drain to the source of the NMOS transistor 91 can appear as a differential open circuit to the primary oscillator 51 and to the auxiliary oscillator 52.

In the illustrated configuration, the first to fourth transmission lines 151-154 are each implemented as a one-eighth wavelength ($\lambda/8$) transmission line, where X is the wavelength of oscillation of the primary oscillator 51. When the NMOS transistor 91 is turned on, the one-eighth wavelength transmission lines can operate differentially as a quarter wavelength transmission line that is terminated by a low impedance electrical path or short circuit. The low impedance electrical path can be transformed in impedance by the transmission lines into an open circuit from the perspective of the primary oscillator 51 and the auxiliary oscillator 52.

In certain implementations, an impedance of the first to fourth transmission lines 151-154 can be selected to be about the same as an impedance of the primary oscillator 51 and the auxiliary oscillator 52 at the frequency of oscillation. Configuring the oscillator system in this manner can aid in preventing impedance mismatches, which can lead to reflections.

Figure 7B:
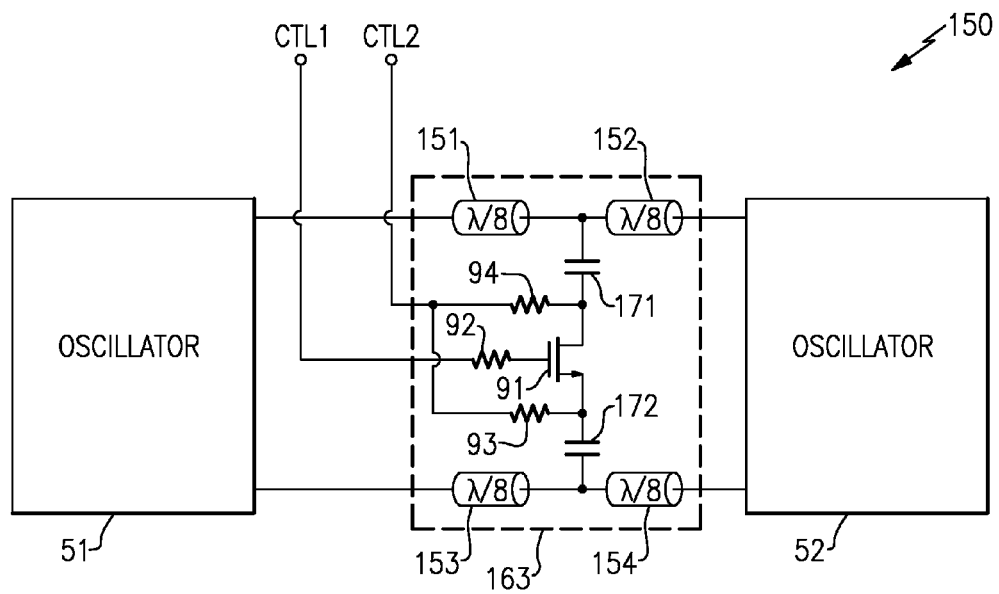
FIG. 7B is a schematic diagram of an oscillator system including a switching circuit according to another embodiment.

FIG. 7B is a schematic diagram of an oscillator system 150 including a switching circuit 163 according to another embodiment.

The oscillator system 150 of FIG. 7B is similar to the oscillator system 140 of FIG. 7A, except that the switching circuit 150 of FIG. 7B further includes a first decoupling capacitor 171 and a second decoupling capacitor 172. For example, the first decoupling capacitor 171 includes a first end electrically connected to the drain of the NMOS transistor 91 and a second end electrically connected to the second end of the first transmission line 151 and to the first end of the second transmission line 152. Additionally, the second decoupling capacitor 172 includes a first end electrically connected to the source of the NMOS transistor 91 and a second end electrically connected to the second end of the third transmission line 153 and to the first end of the fourth transmission line 154.

Including the first and second decoupling capacitors 171, 172 can permit the source and drain voltages of the NMOS transistor 91 to be biased at different DC bias voltages relative to the DC bias voltages of the primary oscillator 51 and the auxiliary oscillator 52. Additional details of the oscillator system 150 can be similar to those described earlier.

APPLICATIONS

Devices employing the above described schemes can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   a primary oscillator;
   one or more auxiliary oscillators comprising a first auxiliary oscillator;
   one or more switching circuits comprising a first switching circuit, wherein the first switching circuit includes a first state and a second state, wherein the first switching circuit is configured to bidirectionally couple the primary oscillator and the first auxiliary oscillator to one another in the first state, and wherein the first switching circuit is configured to decouple the primary oscillator and the first auxiliary oscillator from one another in the second state; and
   an oscillator control circuit having a first output configured to provide a first switch control signal, wherein operation of the first switching circuit in the first state or second state is controlled at least in part by the first switch control signal.

2. The apparatus of claim 1, wherein the oscillator control circuit is further configured to disable the first auxiliary oscillator to reduce power consumption when the first switching circuit operates in the second state.

3. The apparatus of claim 1, wherein the one or more auxiliary oscillators comprises a plurality of auxiliary oscillators comprising a plurality of tanks that can be individually coupled to or decoupled from a tank of the primary oscillator by the oscillator control circuit to provide a configurable phase noise versus power consumption profile.

4. The apparatus of claim 1,
   wherein the one or more auxiliary oscillators further comprises a second auxiliary oscillator,
   wherein the one or more switching circuits further comprises a second switching circuit electrically connected to the second auxiliary oscillator, wherein the second switching circuit includes a first state and a second state, and
   wherein the oscillator control circuit further has a second output configured to provide a second switch control signal, wherein operation of the second switching circuit in the first state or second state is controlled at least in part by the second switch control signal.

5. The apparatus of claim 4, wherein the first switching circuit is electrically connected between the primary oscillator and the first auxiliary oscillator, and wherein the second switching circuit is electrically connected between the primary oscillator and the second auxiliary oscillator.

6. The apparatus of claim 1, wherein the first switching circuit comprises:
   a first field effect transistor (FET) having a source, a drain, and a gate, wherein the source is electrically connected to a first node of the primary oscillator, wherein the drain is electrically connected to a first node of the first auxiliary oscillator, and wherein the gate is electrically connected to the first output of the oscillator control circuit.

7. The apparatus of claim 6, wherein the first switching circuit further comprises:
   a second FET having a source, a drain, and a gate, wherein the source of the second FET is electrically connected to a second node of the primary oscillator, wherein the drain of the second FET is electrically connected to a second node of the first auxiliary oscillator, and wherein the gate is electrically connected to the first output of the oscillator control circuit.

8. The apparatus of claim 7, wherein the first switching circuit further comprises:
a first coupling capacitor electrically connected between the first node of the primary oscillator and the source of the first FET;
a second coupling capacitor electrically connected between the first node of the first auxiliary oscillator and the drain of the first FET;
a third coupling capacitor electrically connected between the second node of the primary oscillator and the source of the second FET; and
a fourth coupling capacitor electrically connected between the second node of the first auxiliary oscillator and the drain of the second FET.

9. The apparatus of claim 7, wherein the first switching circuit further comprises:
a first gate bias resistor electrically connected between the first output of the oscillator control circuit and the gate of the first FET; and
a second gate bias resistor electrically connected between the first output of the oscillator control circuit and gate of the second FET.

10. The apparatus of claim 7, wherein the first switching circuit further comprises:
a third FET having a source, a drain, and a gate, wherein the drain of the third FET is electrically connected to the drain of the first FET, wherein the source of the third FET is electrically connected to the drain of the second FET, and wherein the gate of the third FET is electrically connected to a second output of the oscillator control circuit configured to provide a second switch control signal.

11. The apparatus of claim 10, wherein the first switching circuit further comprises:
a first dampening resistor including a first end electrically connected to the source of the first FET and a second end electrically connected to the drain of the first FET; and
a second dampening resistor including a first end electrically connected to the source of the second FET and a second end electrically connected to the drain of the second FET.

12. The apparatus of claim 7, wherein the oscillator control circuit further has a second output configured to provide a second switch control signal, wherein the first switching circuit further comprises:
a first source bias resistor including a first end that is configured to receive the second switch control signal and a second end electrically connected to the source of the first FET;
a second source bias resistor including a first end that is configured to receive the second switch control signal and a second end electrically connected to the source of the second FET;
a first drain bias resistor including a first end that is configured to receive the second switch control signal and a second end electrically connected to the drain of the first FET; and
a second drain bias resistor including a first end that is configured to receive the second switch control signal and a second end electrically connected to the drain of the second FET.

13. The apparatus of claim 7, wherein the oscillator control circuit further has a second output configured to provide a second switch control signal, wherein the first switching circuit further comprises:
a first source bias inductor including a first end that is configured to receive the second switch control signal and a second end electrically connected to the source of the first FET;
a second source bias inductor including a first end that is configured to receive the second switch control signal and a second end electrically connected to the source of the second FET;
a first drain bias inductor including a first end that is configured to receive the second switch control signal and a second end electrically connected to the drain of the first FET; and
a second drain bias inductor including a first end that is configured to receive the second switch control signal and a second end electrically connected to the drain of the second FET.

14. The apparatus of claim 1, wherein the first switching circuit comprises:
a FET having a source, a drain, and a gate, wherein the gate is electrically connected to the first output of the oscillator control circuit;
a first coupling capacitor electrically connected between a first node of the primary oscillator and the drain of the FET;
a second coupling capacitor electrically connected between a first node of the first auxiliary oscillator and the drain of the FET;
a third coupling capacitor electrically connected between a second node of the primary oscillator and the source of the FET; and
a fourth coupling capacitor electrically connected between a second node of the first auxiliary oscillator and the source of the FET.

15. The apparatus of claim 1, wherein the first switching circuit comprises:
a FET having a source, a drain, and a gate, wherein the gate is electrically connected to the first output of the oscillator control circuit;
a first transmission line including a first end electrically connected to a first node of the primary oscillator and a second end electrically connected to the drain of the FET;
a second transmission line including a first end electrically connected to the drain of the FET and a second end electrically connected to a first node of the first auxiliary oscillator;
a third transmission line including a first end electrically connected to a second node of the primary oscillator and a second end electrically connected to the source of the FET; and
a fourth transmission line including a first end electrically connected to the source of the FET and a second end electrically connected to a second node of the first auxiliary oscillator.

16. The apparatus of claim 15, further comprising:
a first decoupling capacitor including a first end electrically connected to the drain of the FET and a second end electrically connected to the second end of the first transmission line and to the first end of the second transmission line; and
a second decoupling capacitor including a first end electrically connected to the source of the FET and a second end electrically connected to the second end of the third transmission line and to the first end of the fourth transmission line.

17. The apparatus of claim 16, wherein the primary oscillator is configured to oscillate at an oscillation frequency, wherein the first transmission line, the second transmission line, the third transmission line, and the fourth transmission line are each implemented with a length about equal to one-eighth a wavelength of the oscillation frequency.

18. The apparatus of claim 1, wherein the primary oscillator comprises a first inductor-capacitor (LC) tank oscillator, and wherein the first auxiliary oscillator comprises a second LC tank oscillator.

19. The apparatus of claim 1, wherein the primary oscillator comprises a first rotary traveling wave oscillator (RTWO), and wherein the first auxiliary oscillator comprises a second RTWO.

20. An apparatus comprising:
a primary oscillator;
one or more auxiliary oscillators comprising a first auxiliary oscillator;
one or more switching circuits comprising a first switching circuit, wherein the first switching circuit includes a first state and a second state, wherein the first switching circuit is configured to couple the primary oscillator and the first auxiliary oscillator in the first state, and wherein the first switching circuit is configured to decouple the primary oscillator and the first auxiliary oscillator in the second state; and
an oscillator control circuit having a first output configured to provide a first switch control signal, wherein operation of the first switching circuit in the first state or second state is controlled at least in part by the first switch control signal,
wherein the one or more auxiliary oscillators further comprises a second auxiliary oscillator,
wherein the one or more switching circuits further comprises a second switching circuit electrically connected to the second auxiliary oscillator, wherein the second switching circuit includes a first state and a second state, and
wherein the oscillator control circuit further has a second output configured to provide a second switch control signal, wherein operation of the second switching circuit in the first state or second state is controlled at least in part by the second switch control signal,
wherein the first switching circuit is electrically connected between the primary oscillator and the first auxiliary oscillator, and wherein the second switching circuit is electrically connected between the first auxiliary oscillator and the second auxiliary oscillator.

21. The apparatus of claim 20,
wherein the one or more auxiliary oscillators further comprises a third auxiliary oscillator,
wherein the one or more switching circuits further comprises a third switching circuit electrically connected to the third auxiliary oscillator, wherein the third switching circuit includes a first state and a second state, and
wherein the oscillator control circuit further has a third output configured to provide a third switch control signal, wherein operation of the third switching circuit in the first state or second state is controlled at least in part by the third switch control signal,
wherein the third switching circuit is electrically connected between the primary oscillator and the third auxiliary oscillator.

22. An electronically-implemented method of electronic oscillation, the method comprising:
generating a clock signal using an oscillator system comprising a primary oscillator, a plurality of auxiliary oscillators, and a plurality of switching circuits, wherein the plurality of auxiliary oscillators comprises a first auxiliary oscillator;
coupling a first portion of the plurality of auxiliary oscillators to the primary oscillator using a first portion of the plurality of switching circuits, including bidirectionally coupling the primary oscillator and the first auxiliary oscillator to one another;
decoupling a second portion of the plurality of auxiliary oscillators from the primary oscillator using a second portion of the plurality of switching circuits; and
disabling the second portion of the plurality of auxiliary oscillators using an oscillator control circuit to reduce power consumption.

23. The method of claim 22, further comprising:
determining a number of auxiliary oscillators in the first portion and a number of auxiliary oscillators in the second portion based on a desired tradeoff between phase noise and power consumption.

24. The method of claim 22, further comprising:
determining a number of auxiliary oscillators in the first portion and a number of auxiliary oscillators in the second portion based on data stored in a programmable memory of the oscillator control circuit.

25. The method of claim 22, wherein coupling the first portion of the plurality of auxiliary oscillators to the primary oscillator using the first portion of the plurality of switching circuits comprises coupling a first auxiliary oscillator to the primary oscillator using a first switching circuit, wherein the first switching circuit comprises:
a first field effect transistor (FET) having a source, a drain, and a gate, wherein the source is electrically connected to a first node of the primary oscillator, wherein the drain is electrically connected to a first node of the first auxiliary oscillator, and wherein the gate is electrically connected to a first output of the oscillator control circuit; and
a second FET having a source, a drain, and a gate, wherein the source of the second FET is electrically connected to a second node of the primary oscillator, wherein the drain of the second FET is electrically connected to a second node of the first auxiliary oscillator, and wherein the gate is electrically connected to the first output of the oscillator control circuit.

* * * * *